(12) United States Patent
Abe et al.

(10) Patent No.: US 8,744,811 B2
(45) Date of Patent: Jun. 3, 2014

(54) HARNESS DESIGN SUPPORT METHOD AND HARNESS DESIGN SUPPORT APPARATUS

(75) Inventors: Hideki Abe, Kawasaki (JP); Masayoshi Hashima, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 276 days.

(21) Appl. No.: 13/299,473

(22) Filed: Nov. 18, 2011

(65) Prior Publication Data

US 2012/0173207 A1 Jul. 5, 2012

(30) Foreign Application Priority Data

Jan. 4, 2011 (JP) ................. 2011-000260

(51) Int. Cl.
*G06F 17/50* (2006.01)
*G06G 7/48* (2006.01)

(52) U.S. Cl.
USPC ...................................... 703/1; 703/6; 703/7

(58) Field of Classification Search
None
See application file for complete search history.

(56) References Cited

U.S. PATENT DOCUMENTS

| 7,206,723 B2 * | 4/2007 | Sawai et al. ................ 703/1 |
| 7,383,162 B2 | 6/2008 | Hashima et al. |
| 7,480,596 B2 * | 1/2009 | Hashima et al. ............ 703/1 |
| 8,150,661 B2 * | 4/2012 | Demizu et al. ............. 703/1 |
| 8,370,116 B2 * | 2/2013 | Kidera et al. ............... 703/1 |
| 2001/0020223 A1 * | 9/2001 | Kodama et al. ............ 703/2 |
| 2005/0240383 A1 * | 10/2005 | Hashima et al. ........... 703/7 |

FOREIGN PATENT DOCUMENTS

| JP | 2009-086842 | 4/2009 |
| WO | WO-2004-104868 | 12/2004 |

* cited by examiner

*Primary Examiner* — Omar Fernandez Rivas
*Assistant Examiner* — Nithya J Moll
(74) *Attorney, Agent, or Firm* — Fujitsu Patent Center

(57) ABSTRACT

An apparatus and method for supporting harness design. Harness information including a pass position of a harness is set on a three-dimensional model. Then, it is determined whether the harness whose position is decided so as to pass through the set pass position interferes with a mechanical part that is read from a storing unit that stores therein three-dimensional model data on the mechanical part through which the harness passes. When it is determined that the harness interferes with the mechanical part, from among a plurality of surfaces of the mechanical part, a surface that has not been selected is selected, and a pass position of the harness is set outside the selected surface. Then, a position of the harness that passes through the set pass position is decided. These processes are repeated until it is determined that the harness does not interfere with the mechanical part.

6 Claims, 13 Drawing Sheets

HARNESS DESIGN SUPPORT METHOD AND HARNESS DESIGN SUPPORT APPARATUS

CROSS-REFERENCE TO RELATED APPLICATION

This application is based upon and claims the benefit of priority of the prior Japanese Patent Application No. 2011-000260, filed on Jan. 4, 2011, the entire contents of which are incorporated herein by reference.

FIELD

The embodiments discussed herein are directed to designing wiring.

BACKGROUND

In recent years, in developing machine products or apparatuses that include harnesses, such as wire harnesses or cable harnesses, the routing paths of the harnesses are three-dimensionally designed. For example, a user uses three-dimensional computer aided design (CAD) for a mechanical system to create a part model. Then, a harness support apparatus that supports the designing of a routing path for a harness is used to create a three-dimensional model (hereinafter, referred to as a "harness model") of the harness for the part model created by the user. Furthermore, the user designs the routing path of the harness using the harness supporting apparatus while at the same time checking the layout of the part model and harness model relative each other.

FIG. 12 is a schematic diagram for illustrating the harness design support apparatus that supports the designing of a routing path of a harness. As illustrated in (A) of FIG. 12, a user sets, for example, a pass position for the harness, the tangential direction of the pass position, and the length and the width of the harness. Then, in accordance with information on the harness that is set by the user, the harness design support apparatus creates a harness model by using a spline curve or mechanical calculations. Then, as illustrated in (B) of FIG. 12, the harness design support apparatus arranges the created harness model on the part model of a machine product and designs the routing path of the harness (see, for example, International Publication Pamphlet No. WO 2004/104868, and Japanese Laid-open Patent Publication No. 2009-086842).

However, with the conventional technology for designing a routing path of a harness, there is a problem in that the workload imposed on a user increases.

A specific example of a problem for designing a routing path of a harness will be described with reference to FIG. 13. FIG. 13 is a schematic diagram illustrating interference between a harness model and a part model. As illustrated in FIG. 13, when the harness design support apparatus creates such a harness model that the harness passes a pass position that is set by a user, the harness model may interfere with the part model. In such a case, the user adjusts the pass position or the tangential direction of the harness by trial and error, and the harness design support apparatus creates, in accordance with the adjustment made by the user, a harness model that avoids interference with the part model. Accordingly, when designing a harness model that avoids interference with the part model, in some cases, the workload imposed on a user may increase.

SUMMARY

According to an aspect of an embodiment of the invention, a computer readable, non-transitory medium having stored therein a harness design support program causes a computer to execute a process including: setting, on a three-dimensional model, harness information including a pass position of a harness; determining whether the harness whose position is decided so as to pass through the set pass position interferes with a mechanical part that is read from a storing unit that stores therein three-dimensional model data on the mechanical part through which the harness passes; selecting, when it is determined that the harness interferes with the mechanical part, from among a plurality of surfaces of the mechanical part, a surface that has not been selected and setting a pass position of the harness outside the selected surface; deciding a position of the harness that passes through the set pass position; and repeating the process performed at the determining, the selecting, and the deciding until it is determined, at the determining, that the harness does not interfere with the mechanical part.

According to another aspect of an embodiment of the invention, a harness design support method including: setting, on a three-dimensional model, harness information including a pass position of a harness; determining whether the harness whose position is decided so as to pass through the set pass position interferes with a mechanical part that is read from a storing unit that stores therein three-dimensional model data on the mechanical part through which the harness passes; selecting, when it is determined that the harness interferes with the mechanical part, from among a plurality of surfaces of the mechanical part, a surface that has not been selected, and setting a pass position of the harness outside the selected surface; deciding a position of the harness that passes through the set pass position; and repeating the process of the determining, the selecting, and the deciding until it is determined, at the determining, that the harness does not interfere with the mechanical part.

According to still another aspect of an embodiment of the invention, a harness design support apparatus includes: a storing unit that stores therein three-dimensional model data on a mechanical part through which a harness passes; a determining unit that determines, after a pass position is set on the three-dimensional model, whether the harness whose position is determined so as to pass through the pass position interferes with the mechanical part that is read from the storing unit; a setting unit that selects, when it is determined that the harness interferes with the mechanical part, from among a plurality of surfaces of the mechanical part, a surface that has not been selected, and that sets a pass position outside the selected surface; and a deciding unit that decides a position of the harness that passes through the set pass position, wherein the determining unit, the setting unit, and the deciding unit repeat their operations until the determining unit determines that the harness does not interfere with the mechanical part.

According to still another aspect of an embodiment of the invention, a harness design support apparatus includes a memory that stores therein three-dimensional model data on a mechanical part through which a harness passes, and a processor coupled to the memory, wherein the processor is programmed to support harness design by: determining, after a pass position is set on the three-dimensional model, whether the harness whose position is determined so as to pass through the pass position interferes with the mechanical part that is read from the memory; selecting, when it is determined that the harness interferes with the mechanical part, from among a plurality of surfaces of the mechanical part, a surface that has not been selected, and setting a pass position of the harness outside the selected surface; deciding a position of the harness that passes through the set pass position; and repeating the processes of the determining, the selecting, and the deciding until it is determined, at the determining, that the harness does not interfere with the mechanical part.

The object and advantages of the embodiment will be realized and attained by means of the elements and combinations particularly pointed out in the claims.

It is to be understood that both the foregoing general description and the following detailed description are exemplary and explanatory and are not restrictive of the embodiment, as claimed.

DESCRIPTION OF EMBODIMENTS

Preferred embodiments of the present invention will be explained with reference to accompanying drawings. The present invention is not limited to the embodiments described below.

[a] First Embodiment

Figure 1:
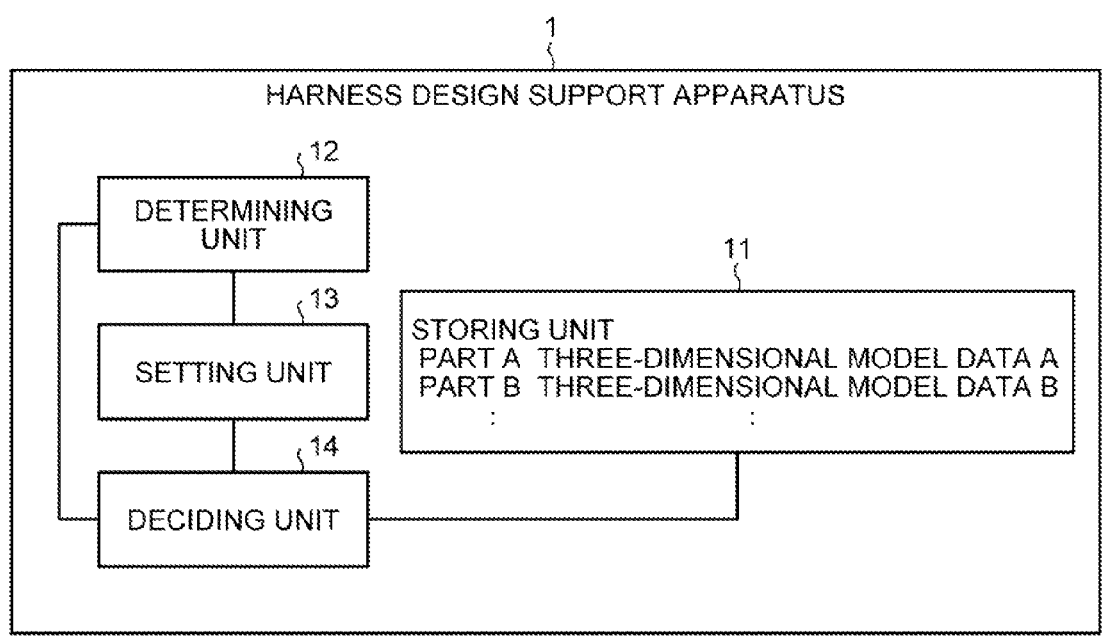
FIG. 1 is a functional block diagram illustrating the configuration of a harness design support apparatus according to a first embodiment.

FIG. 1 is a functional block diagram illustrating the configuration of a harness design support apparatus according to a first embodiment. As illustrated in FIG. 1, a harness design support apparatus 1 includes a storing unit 11, a determining unit 12, a setting unit 13, and a deciding unit 14.

The storing unit 11 stores therein three-dimensional model data related to a mechanical part through which a harness passes. After a pass position is set on a three-dimensional model, the determining unit 12 determines whether the harness that is created such that the harness passes through the pass position interferes with the mechanical part that is read from the storing unit 11.

If it is determined that the harness interferes with the mechanical part, the setting unit 13 selects, from among a plurality of surfaces of the mechanical part, a surface that has not been selected and sets the pass position outside the selected surface. The deciding unit 14 then decides the position of the harness that passes through the set pass position.

The determining unit 12, the setting unit 13, and the deciding unit 14 repeatedly operate until the determining unit 12 determines that the harness does not interfere with the mechanical part.

In this way, the harness design support apparatus 1, repeatedly selects a surface that has not been selected from among the surfaces of the mechanical part interfering with the harness and sets a pass position outside the selected surface until the harness does not interfere with the mechanical part, and determines a position of the harness that passes through the pass position. Accordingly, the harness design support apparatus 1 can automatically create a harness that avoids interference with a mechanical part that interferes with the harness. Therefore, when determining the position of the harness that avoids the interference with the mechanical part, the harness design support apparatus 1 can reduce the workload imposed on a user.

[b] Second Embodiment

Figure 2:
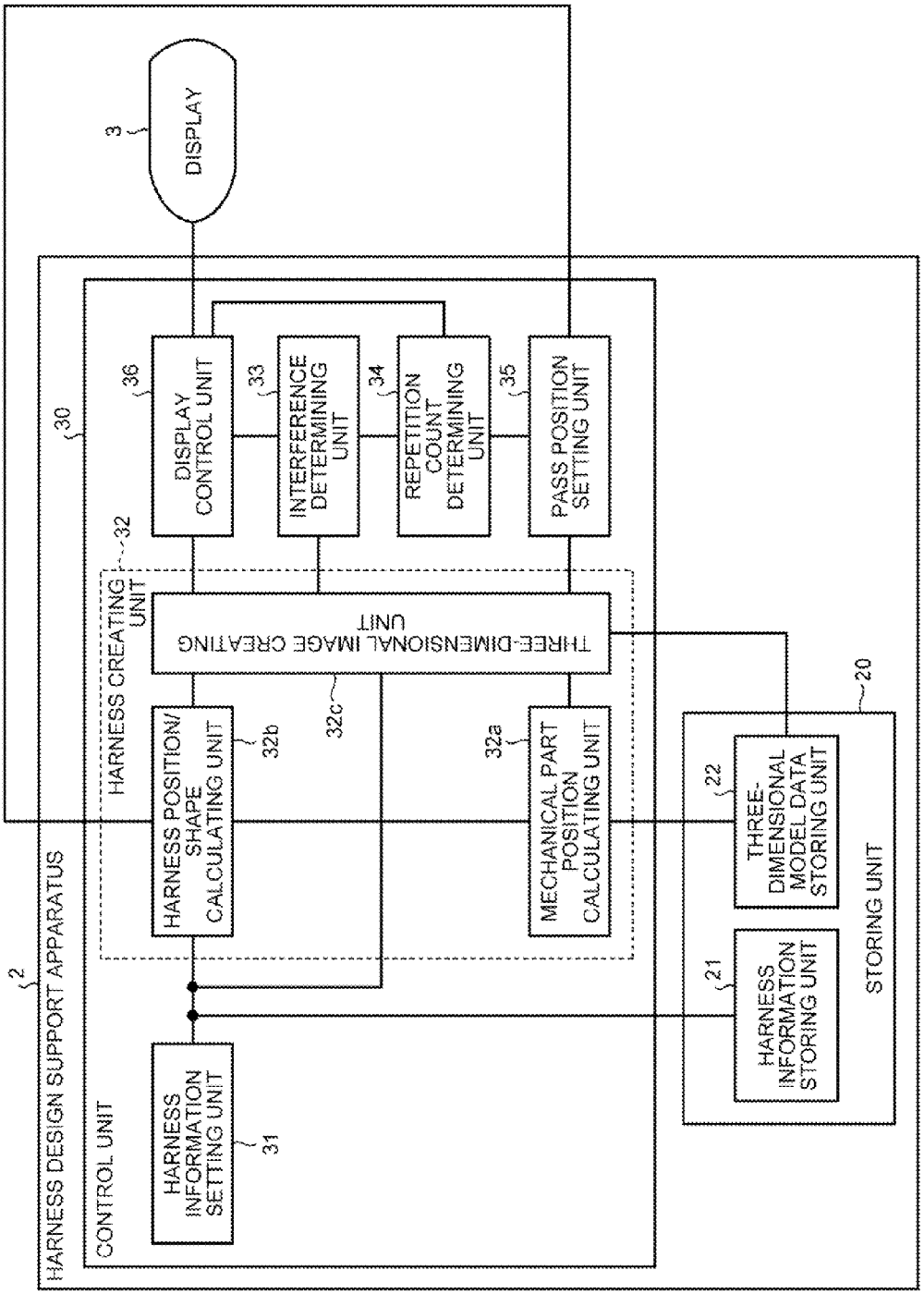
FIG. 2 is a functional block diagram illustrating the configuration of a harness design support apparatus according to a second embodiment.

Configuration of a harness design support apparatus according to a second embodiment FIG. 2 is a functional block diagram illustrating the configuration of a harness design support apparatus 2 according to a second embodiment. The harness design support apparatus 2 functions as an apparatus for supporting the layout design of a harness that is arranged in an apparatus to be designed (for example, a printer, an automobile, a machine tool, and an industrial robot). Examples of the harness mentioned here include, wiring for a signal or electrical power supply, a cable, a wire, piping, a rubber hose, a belt-shaped member, a wire member, and a bundle of these members. Both ends of the harness are connected and secured to connector parts functioning as mechanical parts of the apparatus to be designed. Furthermore, there may be a case in which a portion other than both ends of the harness is secured, as a pass position, by a clamp part.

The harness design support apparatus 2 includes a storing unit 20 and a control unit 30. The storing unit 20 includes a harness information storing unit 21 and a three-dimensional model data storing unit 22. The storing unit 20 includes, for example, a semiconductor memory device, such as a random access memory (RAM) or a flash memory, or includes a storing unit, such as a hard disk or an optical disk.

The harness information storing unit 21 stores therein, for each harness as harness information, information, such as a pass position of the harness, orientation information at each pass position, the length of the harness, the cross-sectional shape of the harness, the color of the harness, curvature information, and harness modeling information. The pass position of the harness includes a starting point position, one or a plurality of mid pass positions, and an end point position. The orientation information at each pass position includes the tangential direction of a harness at each pass position. The harness modeling information mentioned here means various data used when modeling a harness by treating the harness based on harness parts, i.e., small parts. The harness information is input to the control unit 30 via, for example, a keyboard or a file.

The three-dimensional model data storing unit 22 stores therein, for each mechanical part, three-dimensional model data on a mechanical part through which the harness passes.

For example, the three-dimensional model data represents polygon data on a mechanical part.

The control unit 30 performs, in accordance with the harness information and the three-dimensional model data on the mechanical part of the apparatus to be designed, a harness design support process for creating a three-dimensional harness model that does not interfere with the mechanical part. Furthermore, the control unit 30 includes a harness information setting unit 31, a harness creating unit 32, an interference determining unit 33, a repetition count determining unit 34, a pass position setting unit 35, and a display control unit 36. Furthermore, the control unit 30 is an integrated circuit, such as an application specific integrated circuit (ASIC) or a field programmable gate array (FPGA), or is an electronic circuit, such as a central processing unit (CPU) or a micro processing unit (MPU).

The harness information setting unit 31 previously sets the harness information. Specifically, the harness information setting unit 31 stores, in the harness information storing unit 21 as the harness information, various values that are externally input using a keyboard or the like or the harness information setting unit 31 outputs the various values to the harness creating unit 32. A library related to connector parts or clamp parts may previously be stored in the storing unit 20. In such a case, in accordance with the information that is externally input using a keyboard or a mouse, the harness information setting unit 31 selects, from the library in the storing unit 20, the connector parts or the clamp parts. Then, the harness information setting unit 31 can also set, as the harness information, both the starting point position or the end point position of the harness and the orientation information of the harness at that position.

In accordance with the harness information and the three-dimensional model data on the mechanical part that are set by the harness information setting unit 31 or the pass position setting unit 35, the harness creating unit 32 constructs a three-dimensional model for the harness and the mechanical part. Furthermore, the harness creating unit 32 includes a mechanical part position calculating unit 32a, a harness position/shape calculating unit 32b, and a three-dimensional image creating unit 32c.

The mechanical part position calculating unit 32a calculates the position of the mechanical part in accordance with the three-dimensional model data on the mechanical part stored by the three-dimensional model data storing unit 22.

The harness position/shape calculating unit 32b calculates the position and the shape of the harness in accordance with the position of the mechanical part calculated by the mechanical part position calculating unit 32a and the harness information. Specifically, in accordance with the harness information containing the pass position of the harness that is set by the harness information setting unit 31 and in accordance with the position of the mechanical part, the harness position/shape calculating unit 32b calculates the position of the harness and the shape of the harness at this position. Furthermore, the harness position/shape calculating unit 32b calculates the position of the harness and the shape of the harness at this position in accordance with the pass position of the harness that is set by the pass position setting unit 35, which will be described later, in accordance with the orientation information at the pass position, in accordance with the position of the mechanical part, and in accordance with the harness information. For example, by using the pass position of the harness and the orientation information on each pass position, the harness position/shape calculating unit 32b calculates the position and the shape of the harness by approximating them using a Bezier curve.

The three-dimensional image creating unit 32c creates a three-dimensional image of the harness and a three-dimensional image of the mechanical part in accordance with the position and the shape of the harness, in accordance with the position of the mechanical part, in accordance with the harness information, and in accordance with the three-dimensional model data of the mechanical part. Here, the position and the shape of the harness are information calculated by the harness position/shape calculating unit 32b. The position of the mechanical part is information calculated by the mechanical part position calculating unit 32a. The harness information is the information that is set by the harness information setting unit 31 or the information that is stored in the harness information storing unit 21. The three-dimensional model data of the mechanical part is data stored in the three-dimensional model data storing unit 22.

The interference determining unit 33 determines whether the harness interferes with the mechanical part. Specifically, the interference determining unit 33 determines whether the harness can be routed without being obstructed by the mechanical part. More specifically, the interference determining unit 33 determines whether the harness interferes with the mechanical part in accordance with the three-dimensional images of the harness and the mechanical part created by the three-dimensional image creating unit 32c. For example, the interference determining unit 33 creates a bounding box for the harness and a bounding box for the mechanical part and calculates an intersection of the created bounding boxes. If the result of the determination is that an intersection is present, the interference determining unit 33 determines that the harness interferes with the mechanical part. In contrast, if the result of the determination is that an intersection is not present, the interference determining unit 33 determines that the harness does not interfere with the mechanical part.

If the interference determining unit 33 determines that the harness interferes with the mechanical part, the repetition count determining unit 34 determines whether the number of interference determinations performed to determine whether the harness interferes with the mechanical part reaches the upper limit of the number of repetitions. Then, after checking the determination, the repetition count determining unit 34 increments the number of interference determinations by one. Here, the upper limit of the number of repetitions is the upper limit value of the number of repetitions the repetition count determining unit 34 repeatedly checks the interference determinations and is the number of expected repetitions performed until the harness avoids interference with the mechanical part. The specific upper limit of the number of repetitions will be described later. The initial value of the number of interference determinations is "1" and is initialized when the harness design support process is performed.

The pass position setting unit 35 specifies a mechanical part that interferes with the harness (hereinafter, referred to as an "interference member"); selects, from among surfaces of the interference member, a surface that has not been selected; and sets a pass position of the harness outside the selected surface. Specifically, the pass position setting unit 35 sequentially selects surfaces of the interference member so as to search for a pass position in which the harness does not interfere with the interference member; and sets the pass position outside the selected surface. More specifically, if the interference determining unit 33 determines that the harness interferes with the mechanical part and if the repetition count determining unit 34 determines that the number of interference determinations has not reached the upper limit of the number of repetitions, the pass position setting unit 35 specifies, as an interference member, the mechanical part that has been determined to be interfered. Furthermore, to reduce the number of surfaces of the interference member, the pass position setting unit 35 allows the three-dimensional image creating unit 32c to approximate the specified interference member to a three-dimensional convex hull. The three-dimensional convex hull mentioned here means, for example, a cuboid. When it is said that the pass position is set outside the surface, it means, for example, the pass position is set on the surface.

Figure 3:
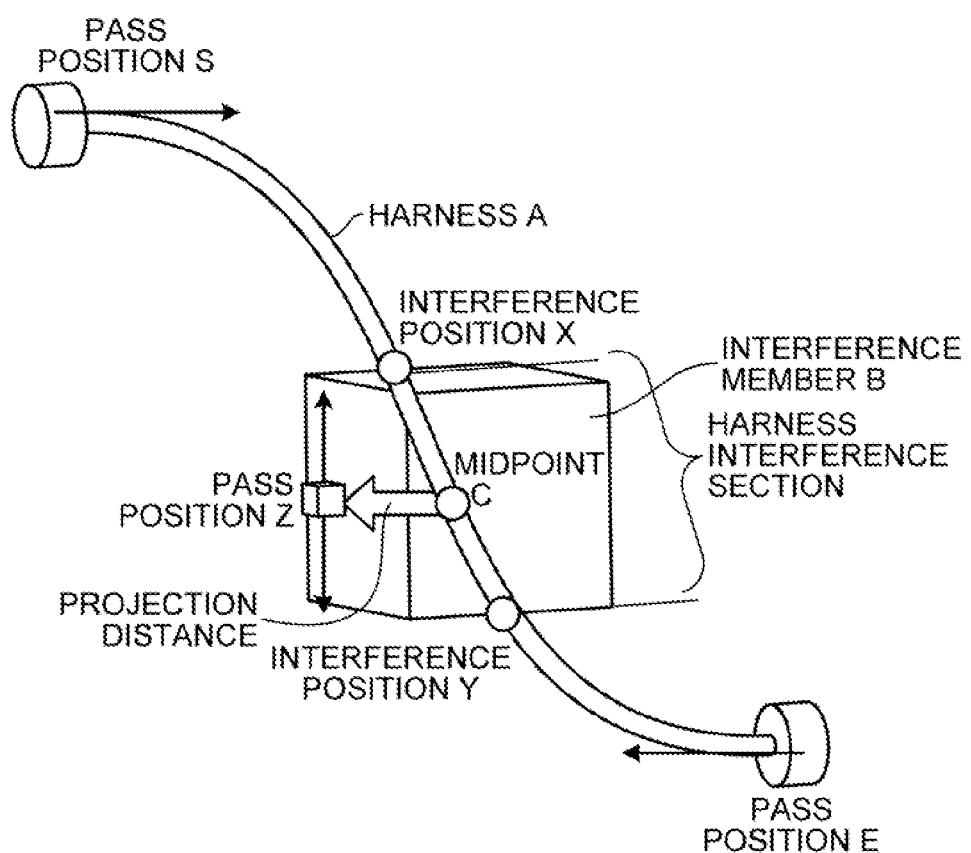
FIG. 3 is a schematic diagram illustrating a specific example of a pass position setting unit.

Furthermore, the pass position setting unit 35 selects, from among a plurality of surfaces of the three-dimensional convex hull of the interference member approximated by the three-dimensional image creating unit 32c, a surface that has not been selected and sets a pass position of the harness outside that surface. Here, a specific example of setting a pass position of the harness performed by the pass position setting unit 35 will be described with reference to FIG. 3. FIG. 3 is a schematic diagram illustrating a specific example of a pass position setting unit. In FIG. 3, a description will be given with the assumption that a harness A interferes with an interference member B and that the interference member B is a three-dimensional image after it has been approximated to the three-dimensional convex hull. As illustrated in FIG. 3, in accordance with the three-dimensional images of the harness A and the interference member B, the pass position setting unit 35 calculates an interference position X, where the harness A interferes with the interference member B, that is the closest to a pass position S representing, for example, the starting point position of the harness A. Furthermore, in accordance with the three-dimensional images of the harness A and the interference member B, the pass position setting unit 35 calculates an interference position Y, where the harness A interferes with the interference member B, that is the closest to a pass position E representing, for example, the end point position of the harness A. Then, the pass position setting unit 35 calculates the position of the midpoint C between the interference position X and the interference position Y. The pass position setting unit 35 calculates the projection distances from the calculated midpoint C to a plurality of surfaces of the interference member B and selects the surfaces of the interference member B in an ascending order of the projection distances. Then, the pass position setting unit 35 sets a point projected on the selected surface from the midpoint C to a pass position Z of the harness. At this time, the pass position setting unit 35 sets the tangential direction at the pass position Z for the harness as vector information and sets the vector information as orientation information.

Referring back to FIG. 2, the pass position setting unit 35 outputs, to the harness position/shape calculating unit 32b, the set pass position and orientation information on the pass position. As described above, the pass position setting unit 35, while repeatedly selecting surfaces of the three-dimensional convex hull of the interference member, sets a pass position outside the selected surface and creates, in the harness creating unit 32, a harness that can avoid interfering with the mechanical part by using, for example, the set pass position. Accordingly, the upper limit of the number of repetitions used by the repetition count determining unit 34 is preferably the number of surfaces of the interference member selected by the pass position setting unit 35, i.e., the number of surfaces of the three-dimensional convex hull of the interference member.

If the interference determining unit 33 determines that the harness does not interfere with any of the mechanical part, the display control unit 36 outputs, to a display 3, the three-dimensional images of the harness and the mechanical part created by the three-dimensional image creating unit 32c.

Flow of the harness design support process performed in the second embodiment

Figure 4:
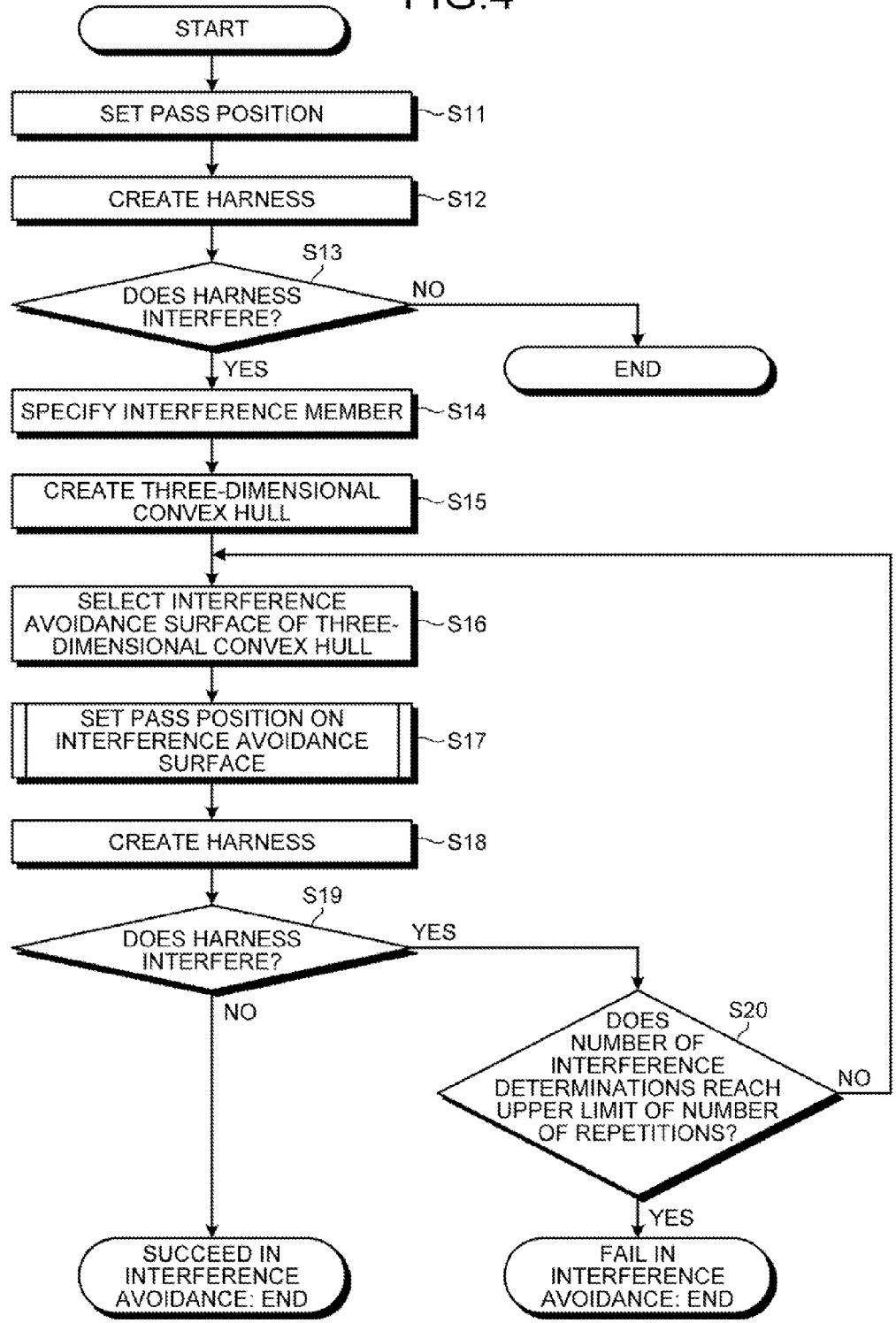
FIG. 4 is a flowchart illustrating the flow of a harness design support process according to the second embodiment.
Figure 5:
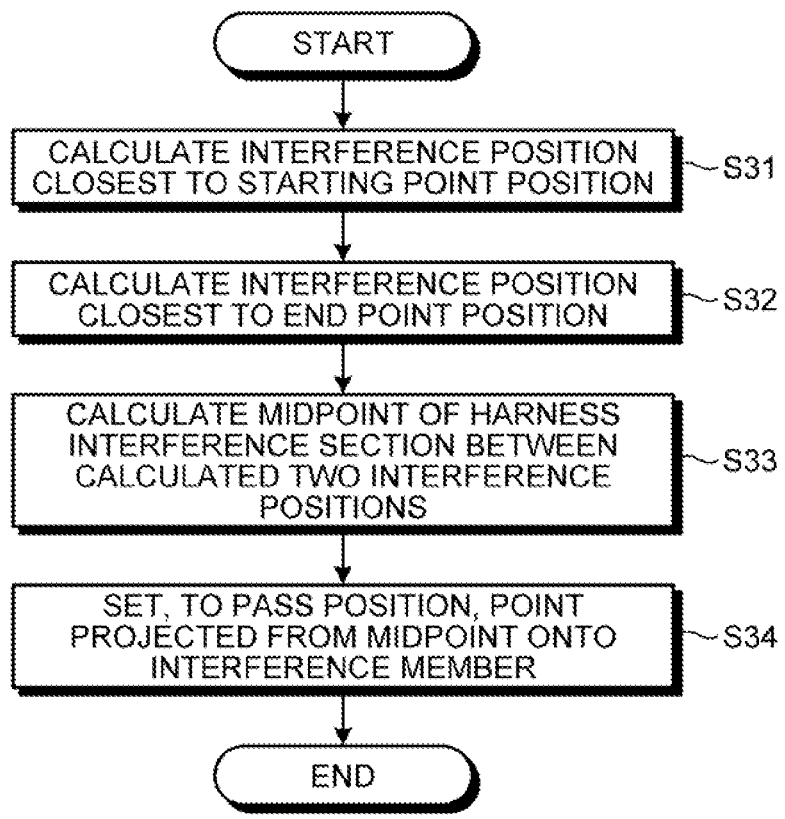
FIG. 5 is a flowchart illustrating the flow of a process for setting a pass position outside a surface.

In the following, the flow of the harness design support process performed in the second embodiment will be described with reference to FIGS. 4 and 5. FIG. 4 is a flowchart illustrating the flow of a harness design support process. FIG. 5 is a flowchart illustrating the flow of a process, in the harness design support process, for setting a pass position outside a surface.

First, the harness information setting unit 31 sets various values, including a pass position, that are input via a keyboard as harness information (Step S11).

Then, in accordance with the harness information that is set by the harness information setting unit 31 and three-dimensional model data of a mechanical part stored by the three-dimensional model data storing unit 22, the harness creating unit 32 creates three-dimensional images of a harness and the mechanical part (Step S12). Specifically, in accordance with the three-dimensional model data of the mechanical part stored by the three-dimensional model data storing unit 22, the mechanical part position calculating unit 32a calculates the position of the mechanical part. Then, in accordance with the position of the mechanical part calculated by the mechanical part position calculating unit 32a and the harness information that is set by the harness information setting unit 31, the harness position/shape calculating unit 32b calculates the position and the shape of the harness. Furthermore, in accordance with the position and the shape of the harness, the position of the mechanical part, the harness information, and the three-dimensional model data of the mechanical part, the three-dimensional image creating unit 32c creates three-dimensional images of the harness and the mechanical part.

Subsequently, in accordance with the three-dimensional images of the harness and the mechanical part created by the three-dimensional image creating unit 32c, the interference determining unit 33 determines whether the harness interferes with the mechanical part (Step S13). For example, the interference determining unit 33 creates bounding boxes for the harness and the mechanical part created by the three-dimensional image creating unit 32c; calculates an intersection of the created bounding boxes to determine whether an intersection is present; and, in accordance with the determination result, determines whether the harness interferes with the mechanical part.

If the interference determining unit 33 determines that the harness does not interfere with the mechanical part (No at Step S13), the interference determining unit 33 ends the harness design support process. In such a case, the display control unit 36 outputs, to the display 3, the three-dimensional images of the harness and the mechanical part created by the three-dimensional image creating unit 32c.

In contrast, if the interference determining unit 33 determines that the harness interferes with the mechanical part (Yes at Step S13), the pass position setting unit 35 specifies the mechanical part that is determined to interfere with the harness as an interference member (Step S14). Then, the pass position setting unit 35 allows the three-dimensional image creating unit 32c to approximates the specified interference member to the three-dimensional convex hull (Step S15).

Subsequently, the pass position setting unit 35 selects, from among surfaces of the three-dimensional convex hull of the interference member approximated by the three-dimensional image creating unit 32c, a surface that has not been selected as an interference avoidance surface (Step S16). For example, the pass position setting unit 35 calculates a midpoint of the position in which the harness interferes with the three-dimensional convex hull; calculates projection distances from the calculated midpoint to the surfaces of the three-dimensional convex hull; and selects the surfaces in the ascending order of the projection distances. Then, the pass position setting unit 35 sets a pass position of the harness outside the selected interference avoidance surface (Step S17). At this time, the pass position setting unit 35 sets the tangential direction of the harness that is set at the pass position as vector information in which a vector is parallel to the selected surface and sets the vector information as the orientation information.

Then, in accordance with the set pass position of the harness, the orientation information, and the three-dimensional model data on the mechanical part stored by the three-dimensional model data storing unit 22, the harness creating unit 32 creates three-dimensional images of the harness and the mechanical part (Step S18).

Subsequently, in accordance with the three-dimensional images of the harness and the mechanical part created by the three-dimensional image creating unit 32c, the interference determining unit 33 determines whether the harness interferes with the mechanical part (Step S19).

Then, if the interference determining unit 33 determines that the harness does not interfere with the mechanical part (No at Step S19), the interference determining unit 33 determines that the harness successfully avoids interfering with the mechanical part and ends the harness design support process. In such a case, the display control unit 36 outputs, to the display 3, the three-dimensional images of the harness and the mechanical part created by the three-dimensional image creating unit 32c.

In contrast, if the interference determining unit 33 determines that the harness interferes with the mechanical part (Yes at Step S19), the repetition count determining unit 34 determines whether the number of interference determinations performed to determine whether the harness interferes with the mechanical part reaches the upper limit of the number of repetitions (Step S20). Then, the repetition count determining unit 34 determines that the number of interference determinations performed to determine whether the harness interferes with the mechanical part does not reach the upper limit of the number of repetitions (No at Step S20), the repetition count determining unit 34 proceeds to Step S16 in order to select the subsequent interference avoidance surface.

In contrast, if it is determined that the number of interference determinations performed to determine whether the harness interferes with the mechanical part reaches the upper limit of the number of repetitions (Yes at Step S20), the repetition count determining unit 34 determines that the harness fails to avoid interference and ends the harness design support process. In such a case, the display control unit 36 can also output, to the display 3, the three-dimensional images of the harness and the mechanical part created by the three-dimensional image creating unit 32c and display information indicating that interference avoidance has failed.

In the following, from among the processes in the harness design support process illustrated in FIG. 4, the flow of a process for setting a pass position outside an interference avoidance surface performed at Step S17 will be described with reference to FIG. 5.

First, in accordance with the three-dimensional image of the harness and the three-dimensional image of the three-dimensional convex hull of the interference member, the pass position setting unit 35 calculates an interference position, between the harness and the three-dimensional convex hull, that is the closest to, for example, a starting point position corresponding to one of the pass positions of the harness (Step S31). Furthermore, in accordance with the three-dimensional images of the harness and the three-dimensional convex hull of the interference member, the pass position setting unit 35 calculates an interference position, between the harness and the three-dimensional convex hull, that is the closest to, for example, an end point position corresponding to one of the pass positions of the harness (Step S32).

Then, the pass position setting unit 35 calculates the position of the midpoint of the calculated two interference positions (Step S33). Furthermore, the pass position setting unit 35 sets, to a pass position of the harness, a point projected from the calculated position of the midpoint onto the interference avoidance surface (Step S34).

Figure 6:
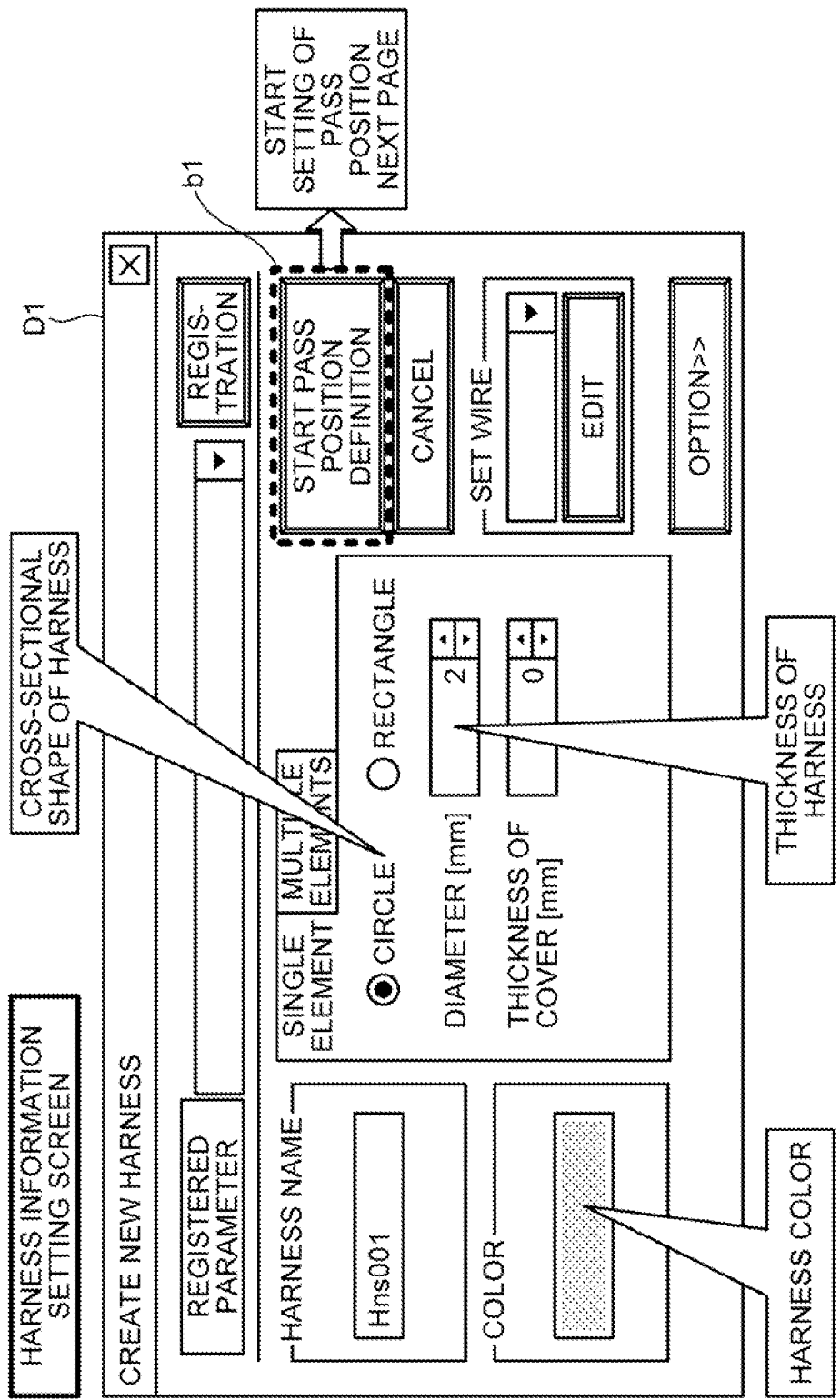
FIG. 6 is a schematic diagram illustrating a specific example of a harness information setting screen.

In the following, a specific example of a display screen displayed on the display 3 in the harness design support apparatus 2 according to the second embodiment will be described with reference to FIGS. 6 and 7. FIG. 6 is a schematic diagram illustrating a specific example of a harness information setting screen D1 used for creating a new harness. As illustrated in FIG. 6, the harness information setting unit 31 displays the harness information setting screen D1 on the display 3 and sets harness information containing values of items that are input by a user. In the example illustrated in FIG. 6, items of the harness information displayed on the harness information setting screen D1 include a harness name for identifying a harness, the color of a harness, the cross-sectional shape of the harness, the diameter of the cross section, and the thickness of a harness cover. The harness information setting screen D1 has a pass position definition start button b1 that changes a screen to a screen for setting a pass position of the harness. When a user presses this button, the harness information setting unit 31 displays a pass position setting screen on the display 3.

Figure 7:
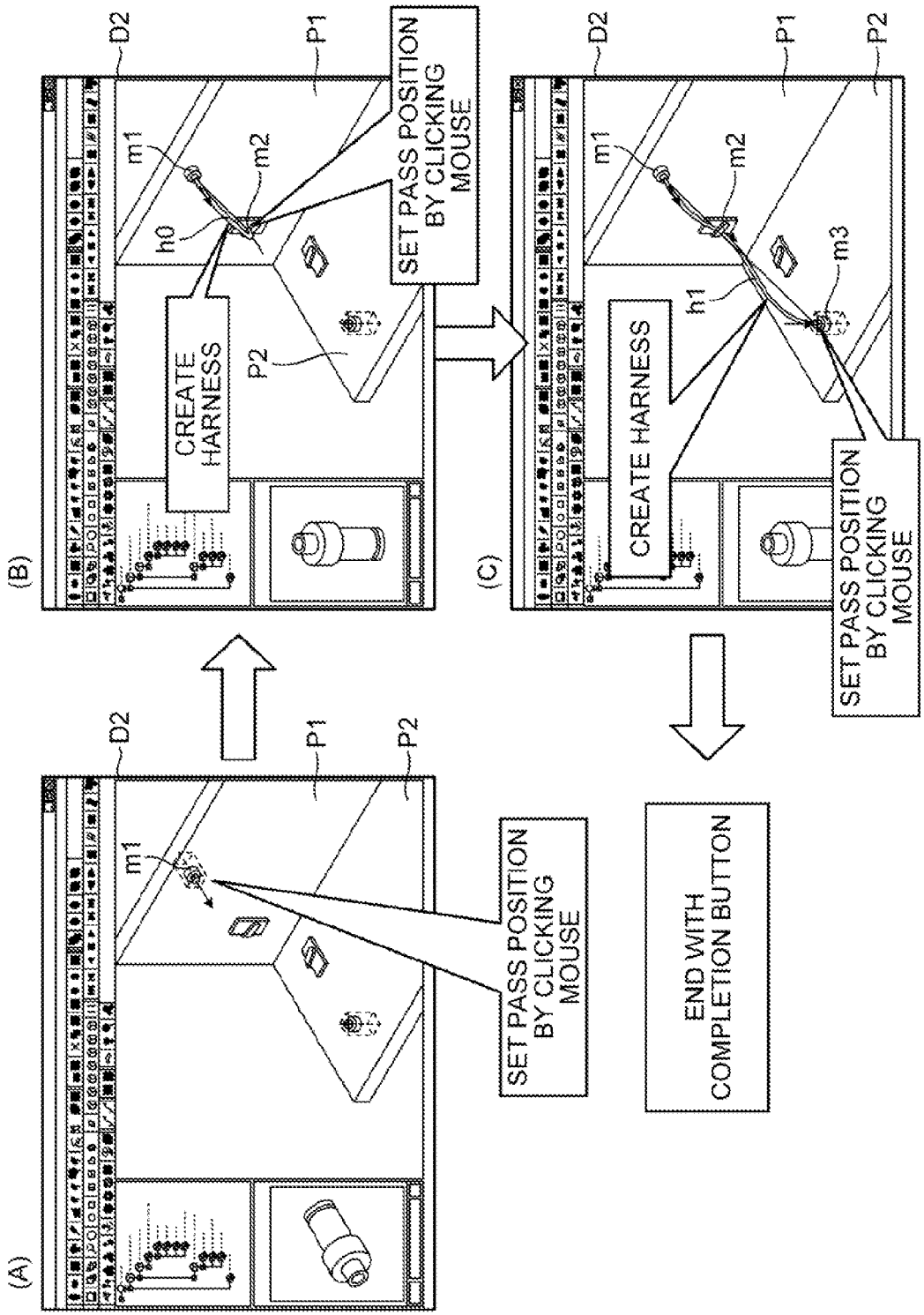
FIG. 7 is a schematic diagram illustrating a specific example of a pass position setting screen.

FIG. 7 is a schematic diagram illustrating a specific example of a pass position setting screen D2 displayed by the harness information setting unit 31. FIG. 7 illustrates in portion (A) an example case in which a first pass position is set. FIG. 7 illustrates in portion (B) an example case in which a second pass position is set. FIG. 7 illustrates in portion (C) an example case in which a third pass position is set. In the examples illustrated in FIG. 7, a description is given with the assumption that a harness is created without interfering with two mechanical parts.

As illustrated in (A) of FIG. 7, a mechanical part P1 and a mechanical part P2 are displayed on the pass position setting screen D2. Then, the harness information setting unit 31 sets a pass position m1 on the mechanical part P1 clicked by a user using a mouse.

Then, as illustrated in (B) of FIG. 7, the harness information setting unit 31 sets a pass position m2 on the mechanical part P1 clicked by the user using the mouse. Then, the harness information setting unit 31 outputs harness information including the set pass positions m1 and m2 to the harness creating unit 32, thereby creating a harness h0 after the processes performed by the harness creating unit 32 and the interference determining unit 33.

Furthermore, as illustrated in (C) of FIG. 7, the harness information setting unit 31 sets a pass position m3 on the mechanical part P2 clicked by the user using the mouse. Then, the harness information setting unit 31 outputs harness information including the set pass positions m2 and m3 to the harness creating unit 32, thereby creating a harness h1 after the processes performed by the harness creating unit 32 and the interference determining unit 33. Accordingly, three-dimensional images of the created harnesses h0 and h1 and the mechanical parts P1 and P2 are set on the pass position setting screen D2 by the display control unit 36. Then, the set pass position setting screen D2 is displayed on the display 3 by the display control unit 36.

Figure 8:
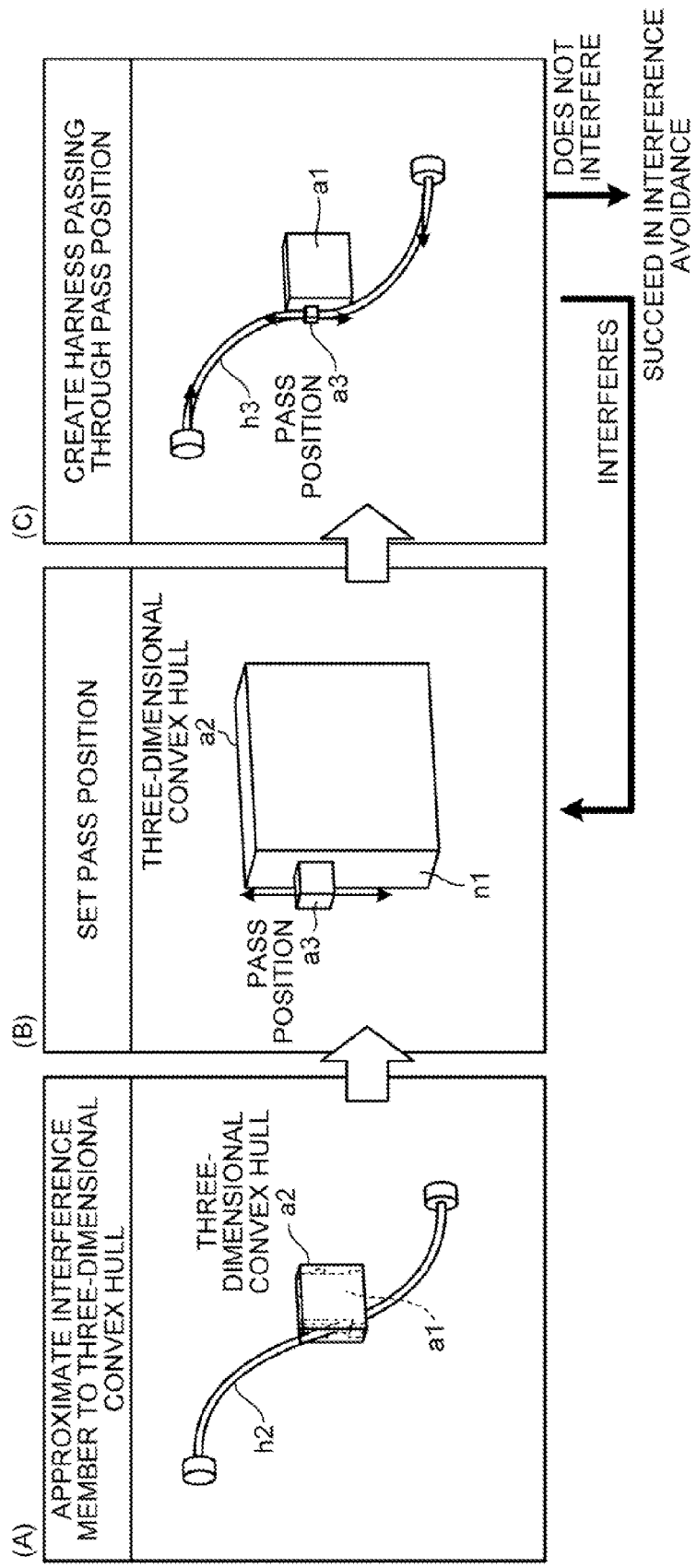
FIG. 8 is a schematic diagram illustrating a specific example of a harness design support process according to the second embodiment.

In the following, a specific example of the harness design support process according to the second embodiment will be described with reference to FIG. 8. FIG. 8 is a schematic diagram illustrating in portion (A) a process for approximating the interference member to a three-dimensional convex hull. FIG. 8 illustrates in portion (B) a process for setting a pass position outside an interference member. FIG. 8 illustrates in portion (C) a process for creating a harness that passes through the pass position.

As illustrated in (A) of FIG. 8, the harness creating unit 32 creates a three-dimensional image of a harness h2 that passes through the pass position set by the harness information setting unit 31 and that has orientation information on the pass position obtained from the harness information and creates a three-dimensional image of a mechanical part a1. Then, the interference determining unit 33 determines whether the harness h2 interferes with the mechanical part a1. In this case, the interference determining unit 33 determines that the harness h2 interferes with the mechanical part a1 and specifies the mechanical part a1 as the interference member. Then, the pass position setting unit 35 approximates the interference member a1 to the three-dimensional convex hull a2.

As illustrated in (B) of FIG. 8, the pass position setting unit 35 selects, from among surfaces of the three-dimensional convex hull a2, a surface that has not been selected (n1 in this case) and sets a pass position a3 outside the selected surface n1. At this time, the pass position setting unit 35 sets the tangential direction of the harness at the pass position a3 as vector information in which a vector is parallel to the selected surface n1 and sets the vector information as the orientation information.

As illustrated in (C) of FIG. 8, the harness creating unit 32 creates a three-dimensional image of a harness h3 that passes through a pass position a3 for the harness set by the pass position setting unit 35 and that has orientation information at the pass position a3 and also creates a three-dimensional image of the mechanical part a1. Then, the interference determining unit 33 determines whether the harness h3 interferes with the mechanical part a1. In this case, the interference determining unit 33 determines that the harness h3 does not interfere with the mechanical part a1; determines that the interference avoidance is successful; and ends the harness design support process.

If it is determined that the harness h3 does not interfere with the mechanical part a1, the pass position setting unit 35 sets a pass position on a surface that is different from the already selected surface n1 of the three-dimensional convex hull a2. Then, the harness creating unit 32 creates a harness that passes through the pass position. Furthermore, the interference determining unit 33 checks whether the created harness interferes with the mechanical part a1. Then, processes are repeatedly performed by the pass position setting unit 35, the harness creating unit 32, and the interference determining unit 33 until there is no interference of the harness checked by the interference determining unit 33, thereby creating a harness that avoids the interference.

In the harness design support process according to the second embodiment, a description has been given with the assumption that the pass position setting unit 35 selects a surface, of the three-dimensional convex hull, that has not been selected and sets a single pass position outside the selected surface. However, the pass position setting unit 35 may also select a surface, of the three-dimensional convex hull, that has not been selected and sets a plurality of pass positions outside the selected surface.

Figure 9:
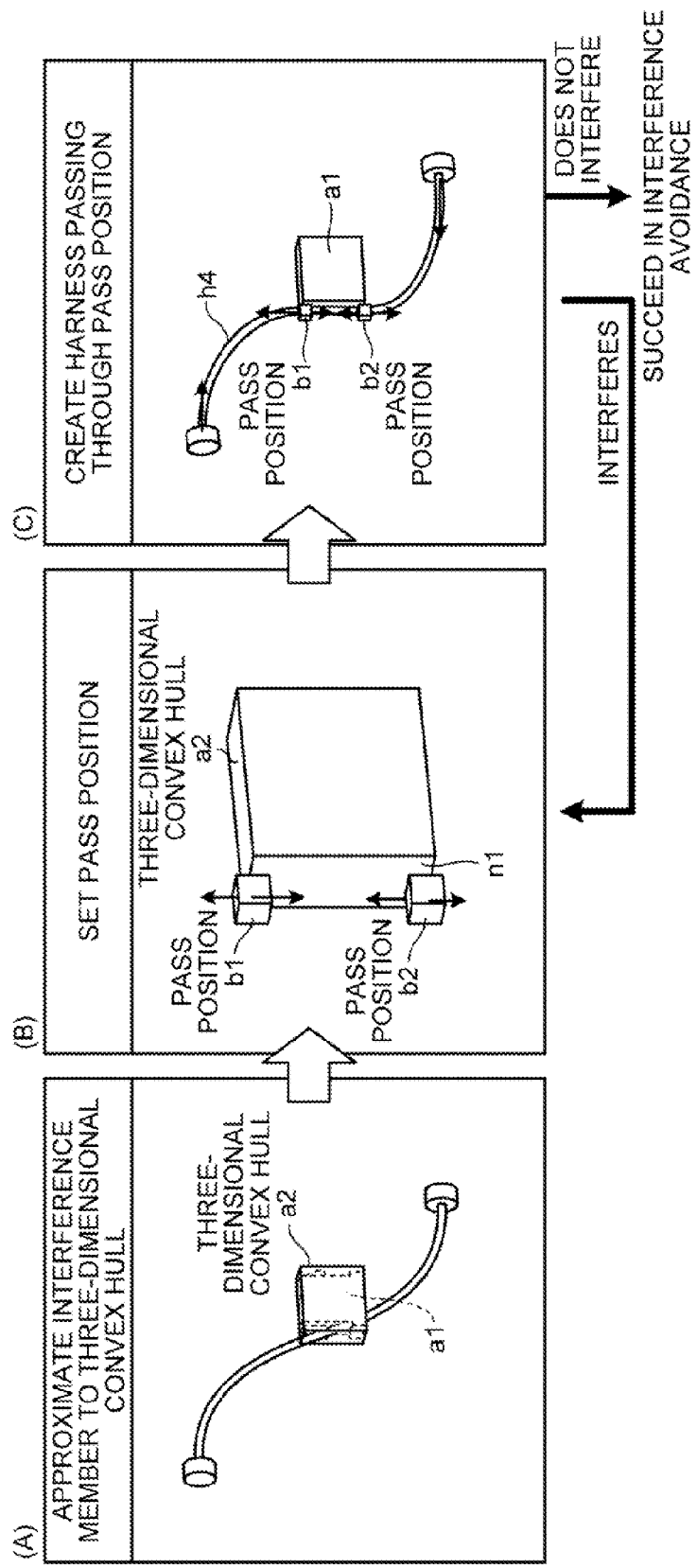
FIG. 9 is a schematic diagram illustrating a modification of the harness design support process according to the second embodiment.

Accordingly, a modification of a harness design support process according to the second embodiment will be described with reference to FIG. 9. FIG. 9 is a schematic diagram illustrating in portion (A) a process for approximating an interference member to the three-dimensional convex hull. FIG. 9 illustrates in portion (B) a process for setting a plurality of pass positions outside the interference member. FIG. 9 illustrates in portion (C) a process for creating a harness that passes through the plurality of pass positions. The process performed in (A) of FIG. 9 is the same as that performed in (A) of FIG. 8; therefore, the description of this process is not repeated here.

If the interference member a1 is approximated to the three-dimensional convex hull a2 by the pass position setting unit 35, as illustrated in (B) of FIG. 9, the pass position setting unit 35 selects, from among the surfaces of the three-dimensional convex hull a2, the surface n1 that has not been selected and sets a plurality of pass positions b1 and b2 outside the selected surface n1. At this time, the pass position setting unit 35 sets the tangential direction of the harness at the pass positions b1 and b2 as the vector information in which a vector is parallel to the selected surface n1 and sets the vector information as orientation information.

As illustrated in (C) of FIG. 9, the harness creating unit 32 creates a three-dimensional image of a harness h4 that passes through the pass positions b1 and b2 of the harness that are set by the pass position setting unit 35 and that has orientation information on the pass positions b1 and b2 and also creates a three-dimensional image of the mechanical part a1. Then, the interference determining unit 33 determines whether the harness h4 interferes with the mechanical part a1. In this case, the interference determining unit 33 determines that the harness h4 does not interfere with the mechanical part a1; determines that the interference avoidance is successful; and ends the harness design support process.

If it is determined that the harness h4 does not interfere with the mechanical part a1, the pass position setting unit 35 sets a plurality of pass positions on a surface that is different from the surface n1 that has already been selected by the interference member a1. Then, the harness creating unit 32 creates a harness that passes through the pass positions. Furthermore, the interference determining unit 33 checks whether the created harness interferes with the mechanical part a1. Then, processes are repeatedly performed until there is no interference of the harness checked by the interference determining unit 33, thereby creating a harness that avoids the interference.

In the harness design support process according to the second embodiment, a description has been given with the assumption that the pass position setting unit 35 selects a surface, of the three-dimensional convex hull, that has not been selected and sets a pass position outside the selected surface. However, the pass position setting unit 35 may also select a surface of the three-dimensional convex hull that has not been selected and set a pass position by providing an offset to the selected surface.

Figure 10:
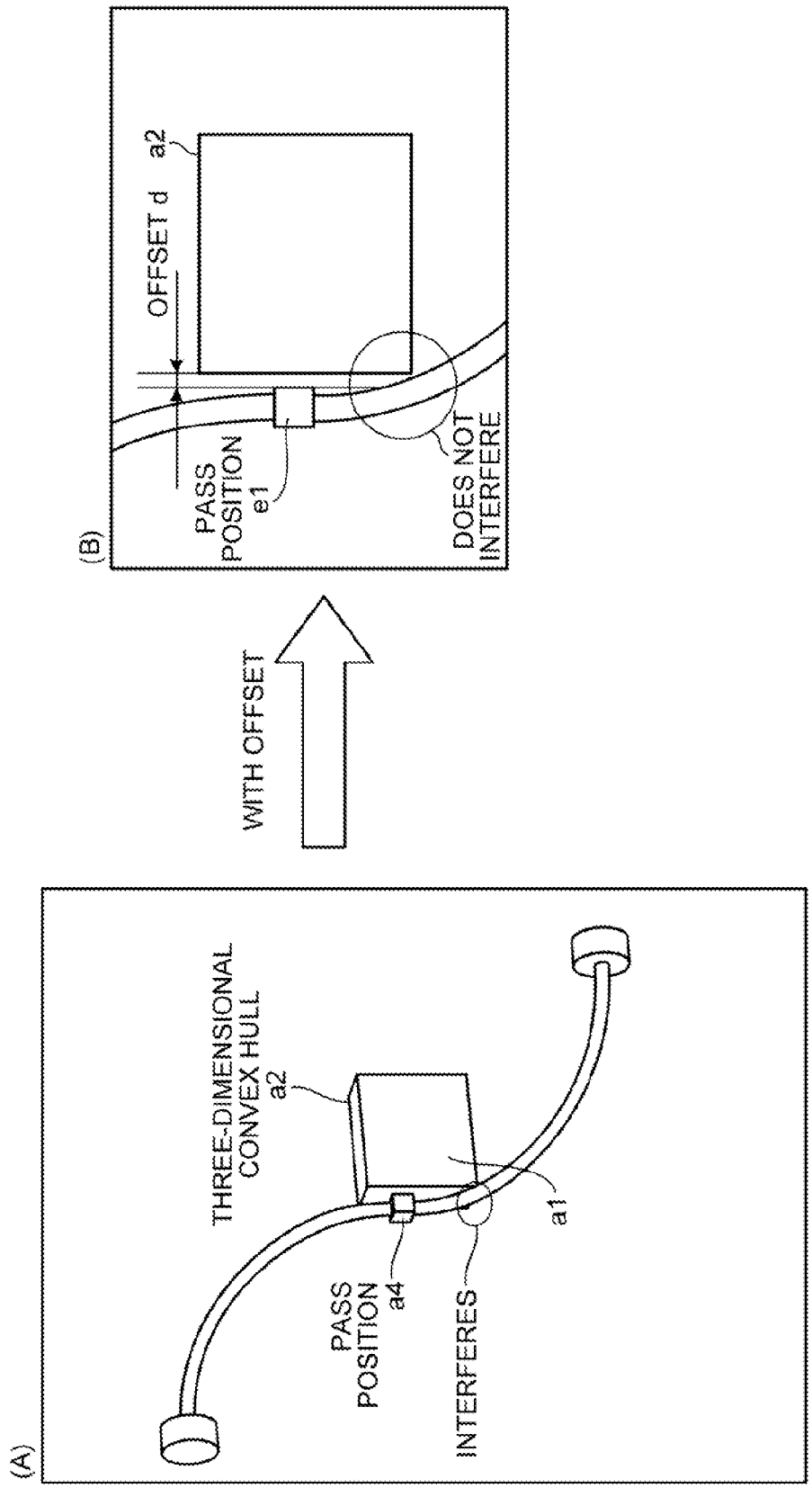
FIG. 10 is a schematic diagram illustrating another modification of the harness design support process according to second embodiment.

In the following, another modification of the harness design support process according to the second embodiment will be described with reference to FIG. 10. FIG. 10 is a schematic diagram illustrating in portion (A) a case in which a pass position is set on the surface. FIG. 10 illustrates in portion (B) a case in which a pass position is set by providing an offset to the surface.

As illustrated in (A) of FIG. 10, if a pass position a4 is set on the surface of the three-dimensional convex hull a2 by the pass position setting unit 35, the harness that passes through the pass position a4 that is set on the surface may interfere with an end of the three-dimensional convex hull a2.

As illustrated in (B) of FIG. 10, if a pass position e1 is set by providing an offset d to the surface, the harness passing through the set pass position e1 easily avoids interference with the end of the three-dimensional convex hull a2. In such a case, the pass position setting unit 35 selects, from among the surfaces of the three-dimensional convex hull a2, a surface that has not been selected and sets a pass position at a position to which an offset d is provided from the selected surface. The length of the offset d is, for example, the length of the radius of the harness; and therefore, d is about 0.5 millimeter (mm) if the thickness of the harness is 1 mm.

Advantage of the Second Embodiment

According to the second embodiment, after a pass position is set on the three-dimensional model, the interference determining unit 33 determines whether a harness that passes through the pass position interferes with a mechanical part whose data is stored by the three-dimensional model data storing unit 22. Then, if the interference determining unit 33 determines that the harness interferes with the mechanical part, the pass position setting unit 35 approximates the mechanical part that interferes with the harness to the three-dimensional convex hull. Then, the pass position setting unit 35 selects, from among a plurality of surfaces of the three-dimensional convex hull, a surface that has not been selected and sets a pass position outside the selected surface. Then, the harness creating unit 32 creates a harness, of the three-dimensional model, that passes through the pass position set by the pass position setting unit 35. The interference determining unit 33, the pass position setting unit 35, and the harness creating unit 32 repeatedly operate until the interference determining unit 33 determines that the harness does not interfere with the mechanical part. With this configuration, the interference determining unit 33, the pass position setting unit 35, and the harness creating unit 32 repeatedly operate until the interference determining unit 33 determines that the harness does not interfere with the mechanical part. Accordingly, the harness design support apparatus 2 can automatically create a three-dimensional model harness that avoids interference with the mechanical part. Accordingly, when creating a harness that avoids the interference with the mechanical part, the harness design support apparatus 2 can reduce the workload imposed on a user.

Furthermore, the pass position setting unit 35 approximates the mechanical part that interferes with the harness to the three-dimensional convex hull; selects, from among a plurality of surfaces of the three-dimensional convex hull, a surface that has not been selected; and sets a pass position outside the selected surface. With this configuration, because the pass position setting unit 35 approximates the mechanical part that interferes with the harness to the three-dimensional convex hull, the number of surfaces on which the pass position is to be set can be reduced compared with the number of surfaces of the original mechanical part. Accordingly, the pass position setting unit 35 can reduce the calculation costs needed for creating a harness that avoids interference. Furthermore, the pass position setting unit 35 approximates the mechanical part that interferes with the harness to the three-dimensional convex hull and sets the pass position outside the three-dimensional convex hull. Accordingly, there is no possibility of the pass position being set outside a concave surface. Thus, the pass position setting unit 35 can enhance the success rate of interference avoidance.

Furthermore, the pass position setting unit 35 selects, from among a plurality of surfaces of the three-dimensional convex hull, a surface that has not been selected and sets a plurality of pass positions outside the selected surface. Then, the harness creating unit 32 creates a harness that passes through the pass positions set by the pass position setting unit 35. With this configuration, the pass position setting unit 35 can create a harness that easily avoids interference.

Furthermore, the pass position setting unit 35 sets a pass position at a position separated from the surface of the three-dimensional convex hull by a distance equal to a predetermined offset. With this configuration, by setting an offset between the pass position and the surface of the three-dimensional convex hull, the pass position setting unit 35 can enhance the possibility of interference avoidance.

Furthermore, the pass position setting unit 35 calculates a midpoint of the positions in which the harness interferes with the surface of the three-dimensional convex hull; calculates the projection distances from the calculated midpoint to the surfaces of the three-dimensional convex hull; and sets pass positions, outside the selected surfaces, in the ascending order of the calculated projection distances. With this configuration, because the pass positions are set in the ascending order of the projection distances from the three-dimensional convex hull, the pass position setting unit 35 can efficiently create a harness that avoids interference.

Additional Matters

In the second embodiment described above, a description has been given with the assumption that, if the interference determining unit 33 determines that the harness interferes with the mechanical part, the pass position setting unit 35 approximates the mechanical part that interferes with the harness to the three-dimensional convex hull and sets a pass position outside the three-dimensional convex hull; however, the pass position setting unit 35 is not limited thereto. For example, if the interference determining unit 33 determines that the harness interferes with the mechanical part, the pass position setting unit 35 may also set a pass position outside a surface of the mechanical part that interferes with the harness.

Furthermore, the harness design support apparatus 1 can be implemented by installing the functions of units described above, such as the storing unit 11 for storing mechanical part information and the determining unit 12 for determining interference, in an information processing apparatus, such as an already known personal computer and a workstation. Furthermore, the harness design support apparatus 2 can be implemented by installing the functions of the control unit 30 and the storing unit 20 described above in an information processing apparatus, such as an already known personal computer and a workstation.

The components of each unit illustrated in the drawings are only for conceptually illustrating the functions thereof and are not always physically configured as illustrated in the drawings. In other words, the specific shape of a separate or integrated unit is not limited to the drawings; however, all or part of the unit may be configured by functionally or physically separating or integrating any of the units depending on various loads or use conditions. For example, the mechanical part position calculating unit 32a may also be integrated with the harness position/shape calculating unit 32b as a single unit. In contrast, the pass position setting unit 35 may be separated by dividing it into a three-dimensional convex hull creating unit that approximates an interference member to a three-dimensional convex hull and a pass position setting unit that sets a pass position outside the three-dimensional convex hull. Furthermore, the storing unit 20 may also be connected via a network as an external unit of the harness design support apparatus 2.

Program

The various processes described in the embodiments can be implemented by a program prepared in advance and executed by a computer system such as a personal computer or a workstation. Accordingly, in the following, a computer that executes the harness design support program having the same function as that performed by the control unit 30 in the harness design support apparatus 2 illustrated in FIG. 2 will be described as an example using FIG. 11.

Figure 11:
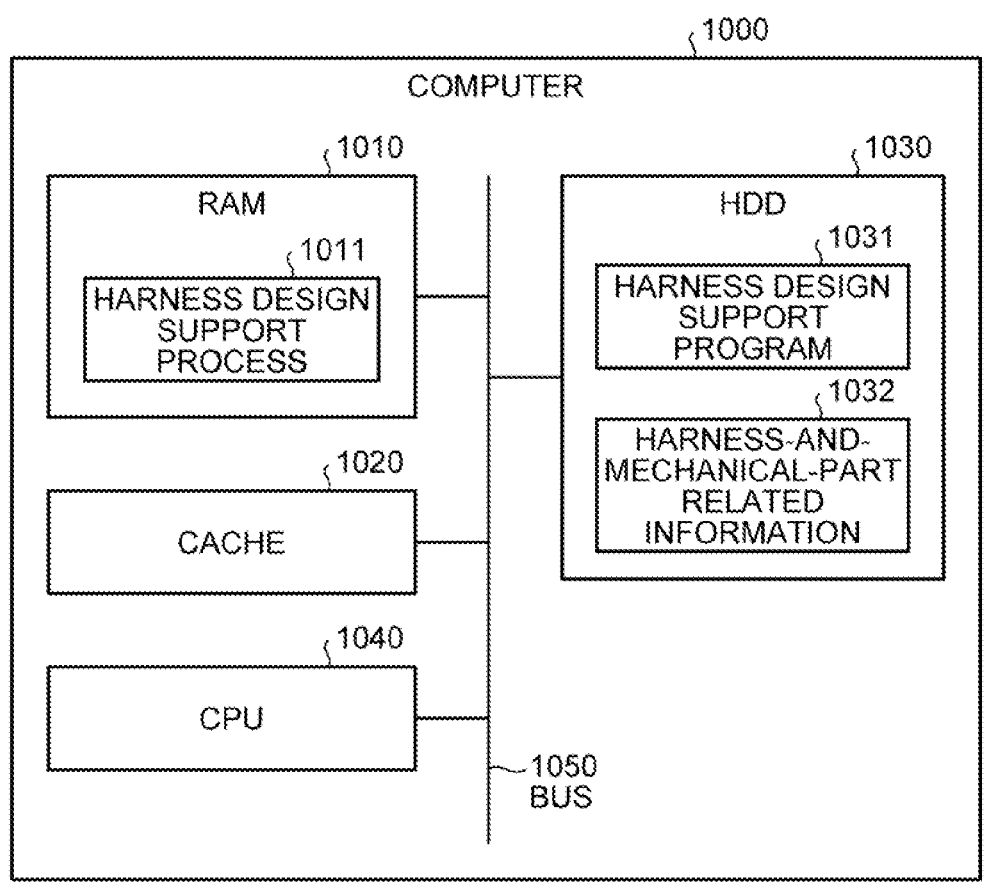
FIG. 11 is a block diagram illustrating a computer that executes a harness design support program.
Figure 12:
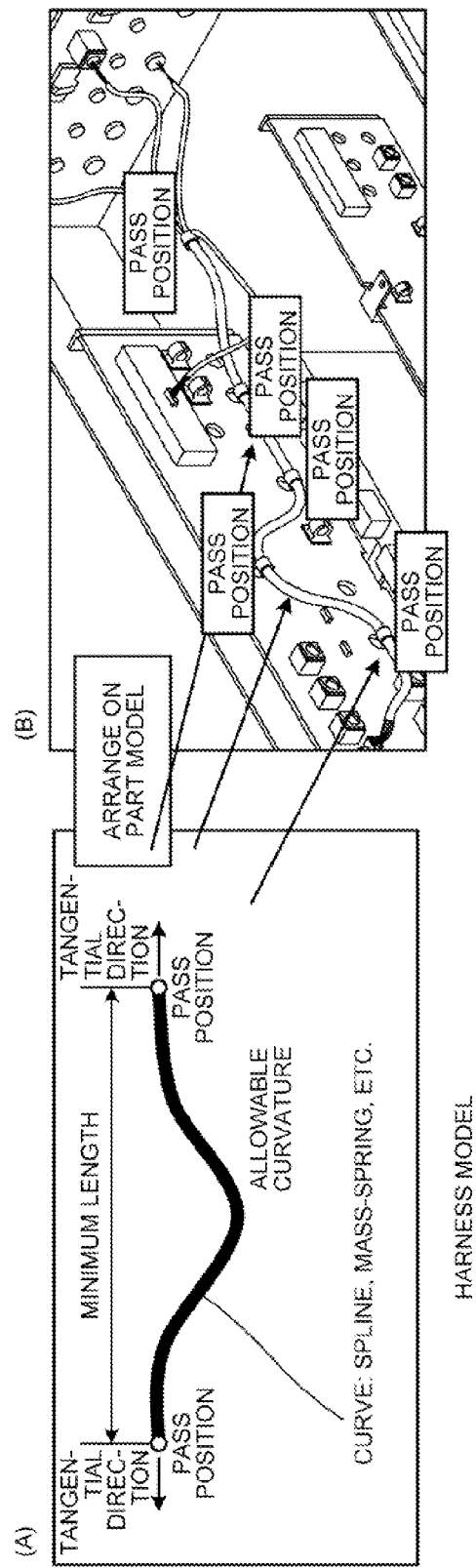
FIG. 12 is a schematic diagram for explaining the harness design support apparatus.
Figure 13:
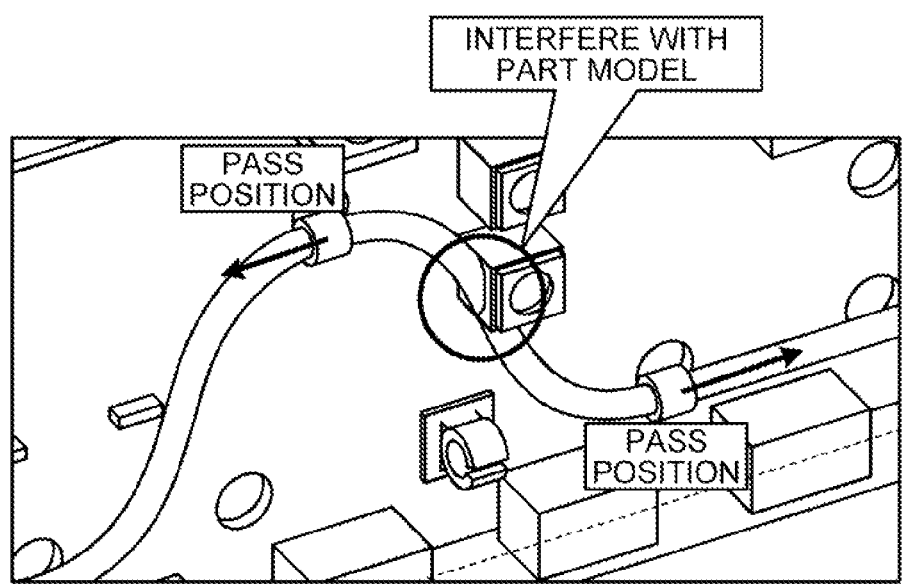
FIG. 13 is a schematic diagram illustrating interference between a harness model and a part model.

FIG. 11 is a block diagram illustrating a computer that executes a harness design support program. As illustrated in FIG. 11, a computer 1000 includes a random access memory (RAM) 1010, a cache 1020, an HDD 1030, a central processing unit (CPU) 1040, and a bus 1050. The RAM 1010, the cache 1020, the HDD 1030, and the CPU 1040 are connected by the bus 1050.

The HDD 1030 stores therein a harness design support program 1031 having the same function as that performed by the control unit 30 illustrated in FIG. 2. Furthermore, the HDD 1030 stores therein harness-and-mechanical-part related information 1032 that corresponds to the harness information storing unit 21 and the three-dimensional model data storing unit 22 illustrated in FIG. 2.

The CPU 1040 reads the harness design support program 1031 from the HDD 1030 and expands it in the RAM 1010, whereby the harness design support program 1031 functions as a harness design support process 1011. Then, the harness design support process 1011 appropriately expands, in an area allocated to the harness design support process 1011 in the RAM 1010, information or the like that is read from the harness-and-mechanical-part related information 1032, and executes processes on various data in accordance with the expanded data or the like.

The harness design support program 1031 is not always stored in the ROM. For example, the harness design support program 1031 may be stored in a "portable physical medium", such as a flexible disk (FD), a CD-ROM, a magneto-optic (MO) disk, a DVD disk, an IC CARD, or the like that is inserted into the computer 1000. Alternatively, the harness design support program 1031 may also be stored in a "fixed physical medium", such as a hard disk drive (HDD) that is arranged inside/outside the computer 1000. Alternatively, the harness design support program 1031 may also be stored in "another computer (or a server)" connected to the computer 1000 via a public circuit, the Internet, a LAN, or a WAN. Then, the computer 1000 may read and execute the program from the flexible disk or the like described above.

According to an aspect of an embodiment of the present invention, in the designing of a routing path of a harness, the workload imposed on a user can be reduced.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A computer readable, non-transitory medium having stored therein a harness design support program causing a computer to execute a process comprising:
    setting, on a three-dimensional model, harness information including a pass position of a harness;
    determining whether the harness whose position is decided so as to pass through the set pass position interferes with a mechanical part that is read from a storing unit that stores therein three-dimensional model data on the mechanical part through which the harness passes;
    approximating, when it is determined that the harness interferes with the mechanical part, the mechanical part that interferes with the harness to a three-dimensional convex hull;
    selecting from among a plurality of surfaces of the approximated three-dimensional convex hull, a surface that has not been selected and setting a pass position of the harness outside the selected surface;
    deciding a position of the harness that passes through the set pass position; and
    repeating the process performed at the determining, the approximating, the selecting, and the deciding until it is determined, at the determining, that the harness does not interfere with the mechanical part.

2. The computer readable, non-transitory medium according to claim 1, wherein
    the selecting further includes setting a plurality of pass positions outside the surface of the three-dimensional convex hull, and
    the deciding includes deciding a position of the harness that passes through the set pass positions.

3. The computer readable, non-transitory medium according to claim 1, wherein the selecting further includes setting a pass position at a position separated from the surface of the three-dimensional convex hull by a distance of a predetermined offset.

4. The computer readable, non-transitory medium according to claim 1, wherein the selecting further includes
    calculating a midpoint of a position in which the harness interferes with the surface of the three-dimensional convex hull,
    calculating projection distances from the calculated midpoint to surfaces of the three-dimensional convex hull, and
    setting pass positions outside the surfaces selected in an ascending order of the calculated projection distances.

5. A harness design support method comprising:
    setting, on a three-dimensional model, harness information including a pass position of a harness using a processor;
    determining whether the harness whose position is decided so as to pass through the set pass position interferes with a mechanical part that is read from a storing unit that stores therein three-dimensional model data on the mechanical part through which the harness passes using the processor;
    approximating, when it is determined that the harness interferes with the mechanical part, the mechanical part that interferes with the harness to a three-dimensional convex hull using the processor;
    selecting, from among a plurality of surfaces of the approximated three-dimensional convex hull, a surface that has not been selected, and setting a pass position of the harness outside the selected surface using the processor;
    deciding a position of the harness that passes through the set pass position using the processor; and repeating the process of the determining, the approximating, the selecting, and the deciding until it is determined, at the determining, that the harness does not interfere with the mechanical part using the processor.

6. A harness design support apparatus comprising:
a memory that stores therein three-dimensional model data on a mechanical part through which a harness passes; and
a processor coupled to the memory, wherein the processor is programmed to support harness design by:
determining, after a pass position is set on the three-dimensional model, whether the harness whose position is determined so as to pass through the pass position interferes with the mechanical part that is read from the memory;
approximating, when it is determined that the harness interferes with the mechanical part, the mechanical part that interferes with the harness to a three-dimensional convex hull;
selecting, from among a plurality of surfaces of the approximated three-dimensional convex hull, a surface that has not been selected, and setting a pass position of the harness outside the selected surface;
deciding a position of the harness that passes through the set pass position; and
repeating the processes of the determining, the approximating, the selecting, and the deciding until it is determined, at the determining, that the harness does not interfere with the mechanical part.

\* \* \* \* \*